United States Patent [19]

Klinger

[11] Patent Number: 4,857,434

[45] Date of Patent: Aug. 15, 1989

[54] RADIATION CURABLE LIQUID (METH) ACRYLATED POLYMERIC HYDROCARBON MALEATE PREPOLYMERS AND FORMULATIONS CONTAINING SAME

[75] Inventor: Lori J. Klinger, Columbia, Md.

[73] Assignee: W. R. Grace & Co., Lexington, Mass.

[21] Appl. No.: 91,169

[22] Filed: Sep. 2, 1987

Related U.S. Application Data

[63] Continuation-in-part of Ser. No. 910,580, Sep. 23, 1986, abandoned.

[51] Int. Cl.$^4$ ............... C08F 222/06; C08F 222/20; C08F 236/06; C08F 236/08
[52] U.S. Cl. ............... 430/286; 430/287; 430/907; 522/107; 522/108; 522/104; 522/122; 522/39; 522/48; 522/910; 522/911; 526/318; 560/199; 560/202
[58] Field of Search ............... 522/182, 108, 107, 104; 524/808; 525/285, 39, 48; 560/199, 202; 430/286-287

[56] References Cited

U.S. PATENT DOCUMENTS

| | | | |
|---|---|---|---|
| 2,934,513 | 4/1960 | Hicks | 528/112 |
| 3,375,301 | 3/1968 | Case | 525/445 |
| 3,376,271 | 4/1968 | Masters | 528/98 |
| 3,376,272 | 4/1968 | Masters | 528/94 |
| 3,376,273 | 4/1968 | Masters | 528/94 |
| 3,382,217 | 5/1968 | Case | 528/297 |
| 3,483,169 | 12/1969 | Case | 528/80 |
| 3,485,733 | 12/1969 | D'Alelio | 560/199 |
| 3,719,728 | 3/1973 | Miranda | 260/861 |
| 3,830,855 | 8/1974 | Inomata et al. | 525/359.2 |
| 3,833,384 | 9/1974 | Noonan et al. | 96/115 P |
| 3,910,992 | 10/1975 | Skillicorn | 260/485 |
| 3,925,330 | 12/1975 | McCarthy | 260/78.5 B |
| 3,931,346 | 1/1976 | Inomata et al. | 526/112 |
| 4,006,024 | 2/1977 | Ibata et al. | 96/115 R |
| 4,033,840 | 7/1977 | Fujiwara et al. | 204/159.17 |
| 4,038,084 | 7/1977 | Nakano et al. | 96/115 P |
| 4,137,081 | 1/1979 | Pohl | 522/182 |
| 4,162,240 | 7/1979 | Hino et al. | 165/1 |
| 4,174,218 | 11/1979 | Pohl | 430/306 |
| 4,192,684 | 3/1980 | Gensho et al. | 430/284 |
| 4,228,232 | 10/1980 | Rousseau | 522/9 |
| 4,288,527 | 9/1981 | Morgan | 430/288 |
| 4,442,302 | 4/1984 | Pohl | 204/159.23 |

FOREIGN PATENT DOCUMENTS

| | | |
|---|---|---|
| 46-10672 | 3/1971 | Japan . |
| 46-14538 | 4/1971 | Japan . |
| 107045 | 10/1974 | Japan . |
| 8055 | 1/1975 | Japan . |
| 50-59491 | 5/1975 | Japan . |
| 50-89101 | 7/1975 | Japan . |

OTHER PUBLICATIONS

"Hycar Vinyl-Terminated Liquid Polymers" (Doc. No. PB-32), The B.F. Goodrich Co., not dated.
"Hycar VT Liquid Polymers-Free Radical Cures with Peroxides and Photocurable Systems", The B.F. Goodrich Co., not dated.

Primary Examiner—John C. Bleutge
Assistant Examiner—Arthur H. Koeckert
Attorney, Agent, or Firm—John J. Wasatonic; William L. Baker

[57] ABSTRACT

This invention is directed to a thermal or radiation curable prepolymer, formulations containing same and processes of using same, said prepolymer comprising a liquid meth(acrylate) terminated polymeric hydrocarbon maleate having pendant maleate groups. Said prepolymer either per se or formulated with mono- or multi-functional unsaturated monomers and either a thermal or photoinitiator on exposure to heat or UV or high energy ionizing radiation forms a cured material utilizable as a printing plate, coating, adhesive or sealant.

16 Claims, No Drawings

RADIATION CURABLE LIQUID (METH) ACRYLATED POLYMERIC HYDROCARBON MALEATE PREPOLYMERS AND FORMULATIONS CONTAINING SAME

This application is a continuation-in-part of U.S. application Ser. No. 910,580, filed Sept. 23, 1986, now abandoned.

BACKGROUND OF THE INVENTION

1. Field of the Invention

This invention relates to a thermal or radiation curable liquid prepolymer, formulations containing same and processes for using same to form printing plates, coatings, adhesives or sealants. More particularly, this invention is directed to a liquid prepolymer comprising a (meth)acrylated polymeric hydrocarbon maleate, either per se or formulated with mono- or multi-functional unsaturated monomers and either a thermal initiator or photoinitiator which, on exposure to heat or UV or high energy ionizing radiation, forms a cured material utilizable as a printing plate, coating, adhesive or sealant.

2. Description of the Prior Art

Photocurable compositions are well known in the art for forming printing plates, coatings, adhesives or sealants. In particular, in the printing plate art, such compositions have made vast inroads in letterpress, offset lithographic and flexographic printing. Initially, the photopolymerizable compositions such as taught in U.S. Pat. No. 2,760,863 required the use of organic solvents for development. However, due to the toxicity, high volatility and low flash point of commercial organic solvents, their use often gave rise to hazardous conditions and created a pollution problem.

Subsequently, U.S. Pat. No. 4,137,081 directed to liquid terminal, olefinic, unsaturated linear polymers in combination with ethylenically unsaturated monomers, a stabilizer and a photoinitiator, resulted in printing plates in which the unirradiated portions can be removed with dilute aqueous solutions of a detergent. However, such materials have a tacky surface which causes the spaces in the relief to fill with ink thereby giving poor printing quality. Japanese No. 82-967 teaches a polymer image forming process comprising exposing a light sensitive composition prepared from a diene polymer having photopolymerizable unsaturated groups, a photopolymerizable vinyl monomer, a photoinitiator and, optionally, a thermal polymerization inhibitor, to UV radiation imagewise and, thereafter, removing the unexposed part of the composition to form a printing plate. The diene polymer such as polybutadiene can have polymerizable unsaturated bonds and be chain extended with epichlorohydrin.

OBJECTS OF THE INVENTION

One object of the instant invention is to provide a liquid thermal or radiation curable prepolymer. Another object of the invention is to provide formulations containing said prepolymer to form printing plates, coatings, adhesives and sealants. A still further object of the instant invention is to provide processes using said prepolymer and formulations containing same to form printing plates, coatings, adhesives and sealants. Yet a further object of the invention is to provide a printing plate composition which is aqueous developable and results in a rapidly cured material with a tack-free surface and good tensile strength. Other objects will become apparent from a reading hereinafter.

DESCRIPTION OF THE INVENTION

This invention relates to a thermal or radiation curable liquid prepolymer and compositions containing this prepolymer. The prepolymer is a polymeric hydrocarbon maleate having terminal (meth)acrylate groups and pendant maleate groups. Thus, a polymeric hydrocarbon is maleated, incorporating the maleate group into the polymer backbone structure, the maleated product is reacted with a methacrylate group-containing reagent to provide a (meth)acrylate terminated polymeric hydrocarbon maleate, and the resultant product is maleated to provide the pendant maleate groups. The second maleation may be onto hydroxyl groups. Thus, the novel polymer may be a liquid hydrocarbon maleate polymer having terminal groups that have the structure of a partially or fully esterified polyhydroxyalkylene group wherein substantially all of the said groups are monoesterified by a carboxylic (meth)acrylic group and some or all are monoesterified by a maleate group. As shown in the formulas below, the polyhydroxyalkylene is preferably dihydroxyethylene.

The liquid maleated and methacrylated polymeric hydrocarbon maleate can be of the formula $P(Y)_a$ where P is a hydrocarbon polymer residue, e.g., a homopolymerized or copolymerized butadiene, isoprene, or chloroprene, including random or block copolymers of these dienes and copolymers of these dienes with comonomers such as styrene, isobutylene, propylene, ethylene, acrylonitrile, acrylic acid or neohexene, or corresponding polymers from which the olefinic unsaturation has been partially removed as partial hydrogenation, a is 1 or more, and Y is a pendant or terminal group containing the meth(acrylate) terminal group and the maleate groups. Generally, a is above 1 and preferably has an average value of 1.8 or greater. The group Y, which may be truly terminal or may be pendant to P, preferably comprises groups of the formula (I):

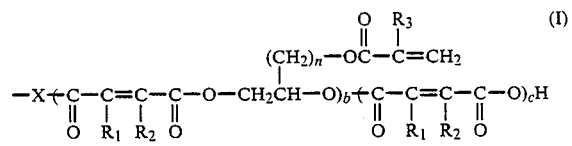

wherein $R_1$ and $R_2$ are each individually hydrogen, halogen, carboxy, linear or cyclic alkyl containing 1-20 carbon atoms, aryl, alkaryl and aralkyl containing 6-20 carbon atoms, $R_3$ is hydrogen or methyl, X is —O—, —S—, or —NR—, R is hydrogen or alkyl of 1 to 6 carbon atoms, n is an integer from 1 to 6, b is an integer from 1 to 10, and c has an average value of 0.1 to 1.0, i.e., an average of 10% to 100% of the groups Y on the polymer include the pendant maleate group.

The prepolymer is typically formed in a process in which a functionalized liquid hydrocarbon polymer is reacted with a reactant to impart maleate groups. Typical functionalized liquid hydrocarbon polymers employed to form the prepolymer of this invention include, but are not limited to, those having backbones of polymerized butadiene, isoprene, or chloroprene, including random or block copolymers of these dienes and copolymers of these dienes with comonomers such as styrene, isobutylene, propylene, ethylene, acrylonitrile acrylic acid, or neohexene, or corresponding polymers from which the olefinic unsaturation has been partially removed as by partial hydrogenation, and containing amine, hydroxyl, or thiol functional groups. Functional polymers and copolymers of the type useful for preparing these polymers include polymers prepared by a free radical polymerization using special catalysts or by anionic polymerization followed by capping the living polymer by ethylene oxide, etc., as described in an article by French in Rubber Chemistry and Technology, Vol. 42, pages 71–107 (1969). The functionalized hydrocarbon polymer generally has a molecular weight in the range of about 1000 to 10,000. It is preferred that the polymers have a molecular weight above 3000, such that a preferred molecular weight range is about 3000 to 10,000.

More particularly, the first step in the preparation of the prepolymer is carried out by reaction of functional or telechelic polymers of the type described by French in the Rubber Chemistry and Technology article referred to above, in which the terminal and/or pendant functional groups are hydroxyl, thiol or amine groups, with an unsaturated carboxylic acid anhydride.

As an illustration of a reaction introducing the maleate group into a functionalized polymer, the reaction between a hydroxyl terminated polybutadiene and maleic anhydride is represented as follows:

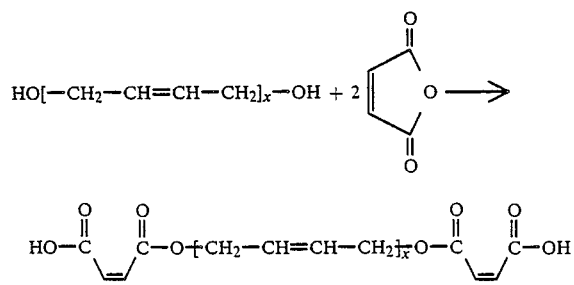

As indicated, approximately two moles of maleic anhydride react with each mole of hydroxyl terminated polybutadiene.

on the polymer, can react with one maleic anhydride molecule.

Any unsaturated anhydride (i.e., maleic or substituted maleic) of the general formula:

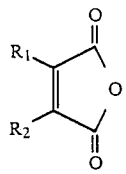

wherein $R_1$ and $R_2$ are individually a member of the group consisting of hydrogen, halogen, carboxy, linear or cyclic alkyl containing 1–20 carbon atoms, aryl, alkaryl and aralkyl containing 6–20 carbon atoms is operable as a reactant with the functional groups, e.g., OH groups on the hydrocarbon polymer, to form the polymeric hydrocarbon maleate in the first step of the instant invention. Additionally, the corresponding unsaturated di-esters and di-acids are also operable as reactants but usually require a longer reaction period. Thus, operable reactants of this type include, but not limited to, 2,3-diphenylmaleic anhydride, dichloromaleic anhydride, 2,3-dimethylmaleic anhydride, maleic anhydride, bromomaleic anhydride, citraconic anhydride and cis-aconitic anhydride.

In the second step of the prepolymer synthesis the liquid polymeric hydrocarbon maleate is reacted with a reagent containing a (meth)acrylate group. In addition to providing reactive (meth)acrylate groups on the polymer, the reaction should also generate an active hydrogen containing group capable of undergoing maleation. For example, the polymeric hydrocarbon maleate formed in the first illustration supra, now containing carboxyl groups from the reaction of hydroxyl terminated polybutadiene and maleic anhydride, is meth(acrylated) by reacting the COOH groups on said prepolymer with, e.g., glycidyl methacrylate (1 mole per equivalent of COOH), with resultant generation of reactive hydroxyl groups:

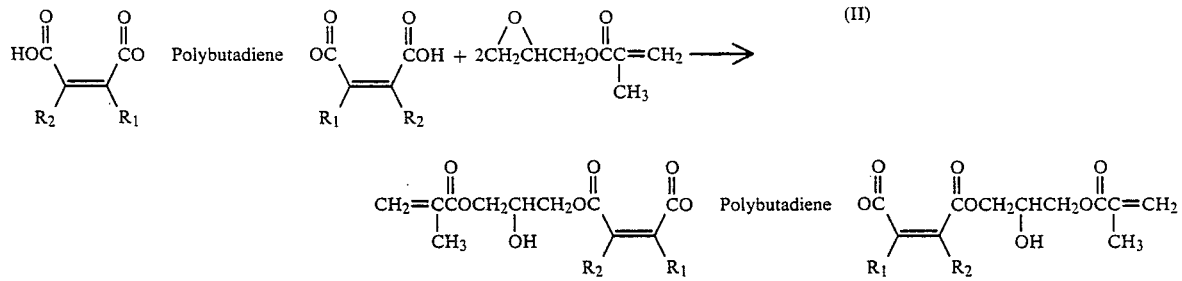

The maleation reaction is preferably carried out at a temperature in the range 60°–120° C. for periods ranging from 4–12 hours. The reaction is preferably carried out in the presence of a thermal inhibitor such as di-t-butyl cresol. Although the reaction is preferably formed in the absence of the solvent, inert solvents such a toluene, benzene, chloroform, methlene chloride, tetrahydrofuran, acetone and ethyl acetate can be employed if desired. Although no catalysts are necessary, catalytic amounts of acids or Lewis acids such as phosphoric acid and stannous octoate can be employed. The reactants are usually added in approximately stoichiometric amounts so that each functional group, e.g., a hydroxyl An excess of epoxy compound can be used if desired. The excess epoxide may react with the hydroxyl groups formed by the initial reaction between the functionally terminated olefin addition polymer and the epoxy compound.

Alternatively, a reagent containing a (meth)acrylate group and an aziridine group may be used for the (meth)acrylation reaction.

This reaction is run at temperatures between 25° and 200° C. with a temperature range of 60°–100° C. being preferred. An acid or basic catalyst is not necessary but can be used to reduce the required reaction temperature and time. Some useful catalysts are sodium hydroxide, sodium ethoxide, triethylamine, triethylbenzyl ammonium chloride, hydrogen chloride and boron trifluoride etherate. Generally, 0.001 to 5.0 % by weight catalyst is used.

In the third step of the prepolymer synthesis, at least some of the active hydrogen containing groups generated in the second reaction step are maleated, thus providing pendant maleate groups on the prepolymer. Thus, in the above example, the hydroxyl groups generated by the reaction with glycidyl methacrylate can be reacted with maleic anhydride to provide the pendant maleate group. It will be appreciated that the pendant maleate group is not incorporated into the polymer backbone (in contrast to the result of the first maleation reaction) but is appendant thereto.

It is preferred that the average number of pendant maleate groups per prepolymer molecule is about 0.2 to 1.6, more preferably about 0.4 to 1.2. This average is derived from the number of active hydrogen containing groups generated in the second reaction step and the degree of maleation. (As used herein, the term "degree of maleation" refers to the percentage of such active hydrogen containing groups which are maleated). For prepolymers of formula (II), for example, which contain two reactive hydroxyl groups per prepolymer molecule, the preferred average range of 0.2 to 1.6 is obtained with a degree of maleation of about 10% to 80%. This degree of maleation is simply obtained by using 0.1 to 0.8 equivalents of the maleating agent per equivalent of OH in the third step of the prepolymer synthesis. Similarly, with regard to formula (I), if it is assumed that a is 2, the above preferred ranges are obtained when c is, respectively, 0.1 to 0.8 or 0.2 to 0.6.

The provision of about 0.2 to 1.6 pendant maleate groups per prepolymer molecule has been found to provide substantially improved dispersibility in aqueous detergent and, after curing, higher tensile strength and tear propagation resistance, less surface tack, and higher surface tension (the latter in particular providing improved printing characteristics in plates made from the prepolymer), as compared to the corresponding prepolymer with lower amounts of or no pendant maleate groups. With the higher molecular weight prepolymers preferred for use in the invention (M.W. greater than about 3000), if the average number of pendant maleate groups per prepolymer exceeds about 1.6, the viscosity of the prepolymer, and most useful photosensitive compositions containing the prepolymer, is generally too high for practical utilization. It has been found that, in general, within the more preferred range of about 0.4 to 1.2 pendant maleate groups per prepolymer, an optimal balance of the above cited advantages and viscosity can be obtained. The cured prepolymers and prepolymer compositions of this invention also exhibit resistance to swelling in water, alcohol and alcohol/acetate solvents used in typical printing inks that is comparable to the swelling resistance of cured formulations containing corresponding prepolymers having no pendant maleate functionality.

With the introduction of the pendant maleate group a free carboxyl group is generated. This, in turn, can be reacted with another glycidyl (meth)acrylate molecule. The sequence can be repeated, ad libitum. to generate a larger number of (meth)acrylate and maleate functions.

In general, the resultant terminal or pendant olefinically unsaturated prepolymers obtained herein are viscous liquids, having Brookfield viscosities, measured at 50° C., of between 1,000 and 5,000,000 centipoises, most preferably between 20,000 and 1,000,000 centipoises.

The composition may also contain up to 90% by weight of a reactive, acrylic or methacrylic diluent of the formula:

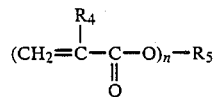

wherein $R_1$ is hydrogen or methyl, and $R_2$ is an organic moiety having the valence of n, and n is 1 or more. Such reactive acrylic diluents include, but are not limited to, trimethlolpropane triacrylate, hexanediol diacrylate, 1,3-butylene glycol diacrylate, diethylene glycol diacrylate, 1,6-hexanediol diacrylate, neopentyl glycol diacrylate, polyethylene glycol 200 diacrylate, tetraethylene glycol diacrylate, triethylene glycol diacrylate, pentaerythritol tetraacrylate, tripropylene glycol diacrylate, ethoxylated bisphenol-A diacrylate, trimethylolpropane triacrylate, di-trimethylolpropane tetraacrylate, triacrylate of tris(hydroxyethyl) isocyanurate, dipentaerythritol hydroxypentaacrylate, pentaerythritol triacrylate, ethoxylated trimethlyolpropane triacrylate, triethylene glycol dimethylacrylate, ethylene glycol dimethacrylate, tertaethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimehhylolpane trimethacrylate, diethylene glycol dimethacrylate,1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate and the like which can be added to the composition to modify the cured product. Monoacrylates such as cyclohexyl acrylate, isobornyl acrylate, lauryl acrylate and tetrahydrofurfuryl acrylate and the corresponding methacrylates are also operable as reactive diluents.

Photoinitiators for the prepolymer and formulations containing same include the benzoin alkyl ethers, such as benzoin methyl ether, benzoin ethyl ether, benzoin isopropyl ether and benzoin isobutyl ether. Another class pf photoinitiators are the dialkoxyacetophenones exemplified by 2,2-dimethoxy-2-phenylacetophenone, i.e., "Irgacure$^{(R)}$ 651" (Ciba-Geigy) and 2,2-diethoxy-2-phenylacetophenone. Still another class of photoinitiators are the aldehyde and ketone carbonyl compounds having at least one aromatic nucleus attahhed directly to the carboxyl group. These photoinitiators include, but are not limited to, benzophenone, acetophenone, o-methoxybenzophenone, acenaphthene-quinone, methyl ethyl ketone, valerophenone, hexanophenone, alpha-phenyl-butyrophenone, p-morpholinopropiophenone, dibenzosuberone, 4-morpholinobenzophenone, 4'-morpholinodeoxybenzoin, p-diacetylbenzene, 4-aminobenzophenone, 4'-methoxyacetophenone, benzaldehyde, alpha-tertalone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]-anthracen-7-one, 1-naphthaldehyde, 4,4'-bis(dimethylamino)-benzophenone, fluorene-9-one, 1'-acetonaphthone, 2'-acetonaphthone, 2,3-butanedione, acetonaphthene, benz[a]anthracene 7.12 diene, etc. phosphines such as triphenylphosphine and tri-o-tolylphosphine are also operable herein as photoinitiators. The photoinitiators or mixtures thereof are usually added in an amount ranging from 0.01 to 5% by weight of the total composition.

A class of actinic light useful herein for curing is ultraviolet light and other forms of actinic radiation which are normally found in radiation emitted from the sun or from artificial sources such as Type RS sunlamps, carbon arc lamps, xenon arc lamps, mercury vapor lamps, tungsten halide lamps and the like. Ultraviolet radiation may be used most effectively if the photocurable composition contains a suitable photoinitiator. Curing periods may be adjusted to be very short and hence commercially economical by proper choice of ultraviolet source, photoinitiator and concentration thereof. Curing periods of about 10 seconds duration are possible, especially in thin film applications such as desired, for example, in coatings. For thicker cured products, curing periods up to 10 minutes, preferably 1-5 minutes, are operable.

When UV radiation is used, an intensity of 0.0004 to 60.0 watts/cm$^2$ in the 200–400 nanometer region is usually employed. High energy ionizing radiation can also be used for the curing step without the use of photoinitiators in the instant invention. If high energy ionizing irradiation is used, e.g., electron beam, a dose in the range of 0.01–10 megarads is employed at a dose rate of $1.0 \times 10^{-4}$ to 4000 megarads/second. Any radiation having an energy of greater than 3.0 electron volts is operable to cause the curing reaction of the instant invention.

The thermal initiators used herein for curing the prepolymer and formulations containing same are free radical initiators which may be selected from substituted or unsubtituted pinacols, azo compounds, thiurams, organic peroxides and mixtures thereof.

The organic peroxides operable are of the general formula:

R—O—O—(R$_1$O—O)n—R wherein n=0 or 1, R is independently selected from hydrogen, aryl, alkyl, aryl carbonyl, alkaryl carbonyl, aralkyl carbonyl and alkyl carbonyl and R$_1$ is alkyl or aryl, said alkyl groups containing 1 to 20 carbon atoms.

Examples of operable organic peroxides include, but are not limited to 2,5-dimethyl-2,5-di(t-butylperoxy)-hexane, 1,3-bis(t-butylperoxyisopropyl) benzene, 1,3-bis-(cumylperoxyisopropyl)benzene, 2,4-dichlorobenzoyl peroxide, caprylyl peroxide, lauroyl peroxide, t-butyl peroxyisobutyrate, benzoyl peroxide, p-chlorobenzoyl peroxide, hydroxyheptyl peroxide, di-t-butyl diperphthalate, t-butyl peracetate, t-butyl perbenzoate, dicumyl peroxide, 1,1-di(t-butylperoxy)-3,3,5-trimethylcyclohexane and di-t-butyl peroxide.

Examples of azo compounds operable herein include, but are not limited to, commercially available compounds such as 2-t-butylazo-2-cyanopropane; 2,2'-azobis-(2,4-dimethyl-4-methoxy-valeronitrile); 2,2'-azobis(isobutyronitrile); 2,2'-azobis-(2,4-dimethylvaleronitrile) and 1,1'-azobis-(cyclohexanecarbonitrile).

The thiurams operable as thermal initiators herein are of the formula:

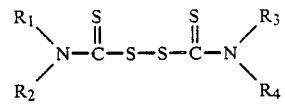

wherein R$_1$, R$_2$, R$_3$ and R$_4$ taken singly can be hydrogen, linear or branched alkyl having from 1 to about 12 carbon atoms, linear or branched alkenyl having from 2 to about 12 carbon atoms, cycloalkyl having from 3 to about 10 ring carbon atoms, cycloalkenyl having from 3 to about 10 ring carbon atoms, aryl having from 6 to about 12 ring carbon atoms, alkaryl having from 6 to about 12 ring carbon atoms, aralkyl having from 6 to about 12 ring carbon atoms, and when taken together, R$_1$ and R$_2$ and R$_3$ and R$_4$ can each be a divalent alkylene group (—C$_n$H$_{2n}$—) having from 2 to about 12 carbon atoms, a divalent alkenylene group (—C$_n$H$_{2n-2}$—) group having from 3 to about 10 carbon atoms, a divalent alkadienylene group (—C$_n$H$_{2n-4}$—) having from 5 to about 10 carbon aroms, a divalent alkatrienylene group (—C$_n$H$_{2n-6}$—) having from 5 to about 10 carbon atoms, a divalent alkyleneoxyalkylene group (—C$_x$H$_{2x}$OC$_x$H$_{2x}$—) having a total of from 4 to about 12 carbon atoms or a divalent alkyleneaminoalkylene group:

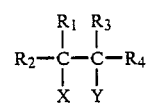

having a total of from 4 to about 12 carbon atoms.

Operable thiurams include, but are not limited to, tetramethylthiuram disulfide, tetraethylthiuram disulfide, di-N-pentamethylenethiuram disulfide, tetrabutylthiuram disulfide, diphenyldimethylthiuram disulfide, diphenyldiethylthiuram disulfide, diethyleneoxythiuram disulfide and the like.

The substituted or unsubstituted pinacols operable herein as a thermal initiator have the general formula:

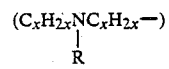

wherein R$_1$ and R$_3$ are the same or different substituted or unsubstituted aromatic radicals, R$_2$ and R$_4$ are substituted or unsubstituted aliphatic or aromatic radicals and X and Y, which may be the same or different, are hydroxyl, alkoxy or aryloxy.

Preferred pinacols are those wherein R$_1$, R$_2$, R$_3$ and R$_4$ are aromatic radicals, especially phenyl radical, and X and Y are hydroxyl.

Examples of this class of compounds include, but are not limited to, benzopinacol, 4,4'-dichlorobenzopinacol, 4,4'-dibromobenzopinacol, 4,4'-diiodobenzopinacol, 4,4',4'',4'''-tetrachlorobenzopinacol, 2,4-2',4'-tetrachlorobenzopinacol, 4,4'-dimethylbenzopinacol, 3,3'-dimethylbenzopinacol, 2,2'-dimethylbenzopinacol, 3,4-3',4'-tetramethylbenzopinacol, 4,4'-dimethoxybenzopinacol, 4,4',4'',4'''-tetramethoxybenzopinacol, 4,4'-diphenylbenzopinacol, 4,4'-dichloro-4'''-dimethylbenzopinacol, 4,4'-dimethyl-4'',4'''-diphenylbenzopinacol, xanthonpinacol, fluorenonepinacol, acetophenonepinacol, 4,4'-dimethylacetophenone-pinacol, 4,4'-dichloroacetophenonepinacol, 1,1,2-triphenyl-propane-1,2-diol, 1,2,3,4-tetraphenylbutane-2,3-diol, 1,2- diphenylcyclobutane-1,2-diol, propiophenone-pinacol, 4,4'-dimethylpropiophenone-pinacol, 2,2'-ethyl-3,3'-dimethoxy-propiophenone-pinacol, 1,1,1,4,4,4-hexafluoro-2,3-diphenyl-butane-2,3-diol.

As further thermal initiators according to the present invention, there may be mentioned: benzopinacol-monomethylether, benzopinacol monophenylether, benzopinacol monoisopropyl ether, benzopinacol monoisobutyl ether, benzopinacol mono-(diethoxymethyl) ether and the like.

The thermal initiators or mixtures thereof are usually added in amounts ranging from 0.01 to 10% by weight of the total composition.

The thermal cure is usually carried out at temperatures in the range 80°–150° C. Full cures may require curing periods up to 30 minutes or more.

To inhibit premature crosslinking during thermal processing and storage of the prepolymer containing compositions of this invention, a thermal polymerization inhibitor and stabilizers are added. Such stabilizers also are well known in the art, and include, but are not limited to, di-t-butyl-p-cresol, hydroquinone monomethylether, pyrogallol, quinone, hydroquinone, methylene blue, t-butyl catechol, hydroquinone monobenzyl ether, methyl hydroquinone, amyl quinone, amyloxy hydroquinone, n-butyl phenol, phenol, hydroquinone monopropyl ether, phenothiazine and nitrobenzene, and mixtures thereof. When used in an amount within the range of from about 0.01 to about 2% by weight of the prepolymer, these stabilizers are quite effective in preventing crosslinking of the prepolymer composition during processing and storage.

When the prepolymer or composition containing same is UV cured, the compositions also may contain up to about 50% by weight of an inert particulate filler which is essentially transparent to actinic light. Such fillers include the organophilic silicas, the bentonites, silica and powered glass, all having a particle size less than 0.4 mil in their maximum dimension. Particles of 0.1 micron or less in size are preferred. Such fillers can impart desirable proeperties to the compositions and reliefs of this invention.

In instances where compositions containing the prepolymer of the instant invention are cured thermally, then an equal amount of conventional fillers such as graphite can be employed.

The prepolymers of this :nvention are particularly suitable for application requiring photopolymers that are exposed imagewise (i.e., through a photographic negative) and, subsequently, developed in aqueous medium, for example, for use as a relief printing plate for letterpress or flexographic printing.

When the prepolymer compositions of this invention are exposed imagewise through a photographic transparency to actinic light at a wavelength of from about 200 to about 400 nanometers, the composition beneath the exposed areas becomes insolubilized, whereas the polymer beneath the unexposed areas remains dispersible in aqueous detergent solutions. Subsequent washing of the plate with aqueous detergent removes the dispersible polymer, leaving a replica of the photographic transparency in relief. Washing will normally be carried out with dilute aqueous solution of an anionic or nonionic detergent. Anionic detergents such as alpha-olefin sulfonates, alkylaryl sulfonates, lauryl sulfate, alkyl esters of sulfosuccinic acid, or sulfated ethylene oxide condensates of alkyl phenols or fatty alcohols, and nonionic detergents such as alkyl phenol, fatty alcohol or fatty acid ethylene oxide condensates may be used. Alpha-olefin sulfonates are particularly useful. Detergent concentrations of about 0.2 to 2% will normally be employed, generally at temperatures of 25°–60° C. Development may frequency be accelerated by brushing or scrubbing. In large scale work, application of the aqueous detergent will advantageously be carried out by means of jets or sprays. In some instances, it may be helpful to use minor quantities of organic solvents such as the short chain aliphatic alcohols and ketones. Suitable solvents of this types include methanol, ethanol and acetone, and they generally will be used in amounts no greater than 25–35%, preferably less than 1–5% of the aqueous detergent developer. Following development of the plate, residual surface water, and any organic solvent which might be present, may be removed by passing a current of warm air over the relief. In some instances it may be desirable to post-expose or post-cure the plates by exposing to actinic light at the wave lengths recited above, after the uncrosslinked photopolymer composition has been washed away.

The following examples will aid in explaining, but expressly not limit, the instant invention. Unless otherwise noted, all parts and percentages are by weight. For purposes of illustration, the liquid hydrocarbon polymer used in the examples will be a hydroxyl terminated polybutadiene.

EXAMPLE 1

500 g of a polybutadiene having 1.9 terminal hydroxyl groups per molecule and an average molecular weight of 4750 were reacted with 17 g of maleic anhydride in the presence of 0.3% 1,6-di-t-butyl-4-methylphenol at 85° C. for 8 hours. The intermediate polybutadiene maleate was further reacted with 25 g of glycidyl methacrylate at 85° C. for 12 hours or until acid functionality was determined to be less than 0.05 meq/g by titration. The resultant methacrylated polybutadiene maleate (790,000 cp at 25° C.) was blended with 2% Irgacure 651 (a Ciba-Geigy tradename) and a 20mil thick sample was irradiated at 11 mW/cm$^2$ between sheets of Mylar for 4 minutes. The cured material was characterized by a modulus of 287 psi, tensile stress of 173 psi, elongation of 104%, Shore A of 45 and resilience of 43%.

EXAMPLE 2

250 g of the methacrylated polybutadiene maleate described in Example 1 was further reacted with 2 g of maleic anhydride at 85° C. for 8 hours or until the anhydride was shown to be consumed by infared analysis. Thus, approximately 25% of the available hydroxyl functionality on the intermediate methacrylated polybutadiene maleate was maleated to give a polymer with a viscosity of 1,612,000 cp at 25° C. The prepolymer was blended with 2% Igracure 651 and irradiated as described in Example 1 to give a cured material with a modulus of 441 psi, tensile stress of 260 psi, elongation of 103%, Shore A of 57 and resilience of 50%.

EXAMPLE 3

250 g of the methacrylated polybutadiene maleate described in Example 1 was further reacted with 4 g of maleic anhydride at 85° C. for 11 hours or until the anhydride was shown to be consumed by infrared analysis. Thus, approximately 50% of the available hydroxyl functionality on the intermediate methacrylated polybutadiene maleate was maleated to give a polymer with a viscosity of greater than 2,000,000 cp at 25° C. The prepolymer was blended with 2% Irgacure 651 and irradiated as described in Example 1 to give a cured material with a modulus of 537 psi, tensile stress of 321 psi, elongation of 90%, Shore A of 61 and resilience of 57%.

EXAMPLE 4

100 g of the methacrylated polubutadiene maleate described in Example 1 was formulated with 43 g of isobornyl methacrylate, 13 g of lauryl methacrylate and 0.8 g of Irgacure 651 to give a composition with a viscosity if 21,000 cp at 25° C. The formulation was irradiated as described in Example 1 to give a cured film with a modulus of 200 psi, tensile stress of 465 psi, elongation of 224%, Shore A of 42. resilience of 13%, and tear propagation resistance of 1.9 lbs./in.

EXAMPLE 5

100 g of the twice maleated polybutadiene described in Example 2 was formulated with 43 g of isobutyl methacrylate, 13 g of lauryl methacrylate and 0.8 g of Igracure 651 to give a composition with a viscosity of 32,000 cp at 25° C. The formulation was irradiated as described in Example 1 to give a cured film with a modulus of 420 psi, tensile stress of 540 psi, elongation of 195%, Shore A of 58, resilience of 18%, and tear propagation resistance of 4.6 lbs./in.

EXAMPLE 6

100 g of the twice maleated polybutadiene described in Example 3 was formulated with 47 g of isobornyl methacrylate, 25 g of lauryl methacrylate and 0.8 g of Irgacure 651 to give a composition with a viscosity of 29,000 cp at 25° C. The formulation was irradiated as described in Example 1 to give a cured film with a modulus of 310 psi, tensile stress of 580 psi, elongation of 192%, Shore A of 58 resilience of 16%, and tear propagation resistance of 6.5 lbs./in.

EXAMPLE 7

To make printing plates for flexographic printing, a photographic negative was placed on the lower glass plate of a commercial type exposure unit and covered with a polypropylene cover sheet. The polymer formulations described in Examples 4–6 were individually applied to the polypropylene cover sheet to a depth of 110 mils. The respective applied formulations were covered with 5-mil Mylar backing sheets. To provide a base or floor, the polymer formulations were exposed through the Mylar backing to a bank of UV lights (2.6 mW/cm$^2$) for 40 seconds. They were subsequently exposed imagewise through the negative to a bank of UV lights (3.6 mW/cm$^2$) for 3 minutes. The exposed plate was stripped of its cover sheet and developed in a commercial-type rotary wash-out unit with a spray of aqueous detergent solution containing 1.0% of a 40% solution of a sodium alpha olefin sulfonate (sold by Stepan Chemicals as Bioterge AS-40) and 0.3% of a 15% silicone defoamer emulsion (sold as Defoamer H-10 by Dow-Corning). After washing, the plate was post-exposed under water with a fluorescent lamp for ten minutes.

Printing plates prepared from the formulations described in Examples 4–6 had comparable resistance to swell in both aqueous and solvent-based inks but exhibited substantial differences in appearance, surface tack and printability. In particular, compositions containing pendant maleate functionality (as described in Example 5 and 6) were more readily dispersed in the aqueous detergent solution, as evidenced by the substantially tack-free surface and matte finish on the floor of the plate. Plates prepared from compositions containing pendant maleate functionality (Examples 5 and 6) also had a higher surface tension than those prepared from material without pendant maleation (Example 4). As a result, the former were found to have superior ink transfer capabilities.

Thus a printing plate prepared from the formulation described in Example 6 (50% of the pendant hydroxy functionality maleated) had a surface tension of 43 dynes/cm and exhibited a tack-free and smooth floor. Plates prepared from the formulation described in Example 5 (25% of the pendant hydroxyl functionality maleated) had a surface tension of 41 dynes/cm and exhibited a smooth floor with a slight degree of surface tack. The formulation described in Example 4 (no pendant maleation) gave printing plates characterized by a surface tension of 38 dynes/cm with a textured and significantly tacky floor.

What is claimed is:

1. A liquid thermal or radiation curable composition comprising a (meth)acrylate terminated, olefinically unsaturated maleate prepolymer having pendant maleate groups, said prepolymer having the formula P(Y)a wherein P is a homopolymer or copolymer of butadiene, isoprene, or chloroprene, a copolymer of butadiene, isoprene, or chloroprene with styrene, isobutylene, propylene, ethylene, acrylonitrile, acrylic acid, or neohexene, or corresponding partially hydrogenated polymers, a is one or more, and Y is a pendant or terminal group attached to P having the structure

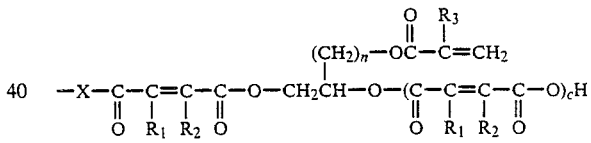

wherein $R_1$ and $R_2$ are each individually hydrogen, halogen, carboxy, linear or cyclic alkyl containing 1–20 carbon atoms, aryl, alkaryl and aralkyl containing 6–20 cargon atoms, $R_3$ is hydrogen or methyl, X is —O—, —S—, or —NR—, R is hydrogen or alkyl of 1 to 6 carbon atoms, n is an integer from 1 to 6, and c has an average value of 0.1 to 1.0.

2. A composition of claim 1 containing an average of 0.2 to 1.6 pendant maleat groups per prepolymer molecule.

3. A composition of claim 1 containing an average of 0.4 to 1.2 pendant maleat groups per prepolymer molecule.

4. A composition of claim 3 wherein said prepolymer has a molecular weight greater than about 3000.

5. A composition of claim 1 further comprising up to 90% by weight of a reactive monomer of the formula

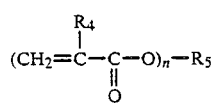

wherein $R_4$ is hydrogen or methyl, $R_5$ is an organic moiety having a valence of n, and n is 1 or more.

6. A composition of claim 5 further comprising a photoinitiator.

7. A composition of claim 5 further comprising a thermal initiator.

8. A composition of claim 1 wherein a is about 1.8 or greater and c is about 0.1 to 0.8.

9. A composition of claim 8 wherein c is about 0.2 to 0.6.

10. A composition of claim 1 wherein X is -0-, n is 1, $R_1$ and $R_2$ are hydrogen, and $R_3$ is methyl.

11. A composition of claim 10 wherein a is about 1.8 or greater and c is aobut 0.1to 0.8.

12. A photopolymer element comprising a support and a layer comprising the composition of claim 1.

13. A process of forming a (meth)acrylate terminated, olefinically unsaturated, maleate prepolymer having pendant maleate groups which consists essentially of (a) reacting an olefinicallly unsaturated polymer selected from the group consisting of a homopolymer or copolymer of butadiene, isoprene, or chloroprene, a copolymer of butadiene, isoprene, or chloroprene wit styrene, isobutylene, propylene, ethylene, acrylonitrile, acrylic acid, or neohexene, and corresponding partially hydrogenated polymers and containing terminal functional group members selected from the group consisting of amine, hydroxyl and thiol with a member of the group consisting of an unsaturated anhydride of the general formula:

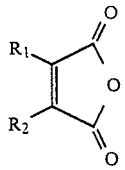

wherein $R_1$ and $R_2$ are individually a member of the group consisting of hydrogen, halogen, carboxyl, linear or cyclic alkyl containing 1-20 carbon atoms, aryl, alkaryl and aralkyl containing 6 to 20 carbon atoms and the corresponding di-esters and di-acids for a time sufficient to form an olefinically unsaturated maleat polymer having terminal carboxyl groups, (b) reacting said terminal carboxyl groups with a reagent containing a (meth)acrylate group and a group selected from oxirane and axiridine to form a (meth)acrylate terminated, olefinically unsaturate,, maleate polymer having pendant active hydrogen containing groups, said reaction being carried out at a temperature in the range 25°-200° C., and, thereafter, (c) reacting said active hydrogen containing groups with about 0.1 to 0.8 equivalents of said unsaturated anhydride.

14. A process of claim 13 wherein said olefinically unsaturated polymer is a hydroxy terminated polybutadiene.

15. A process of claim 14 wherein said unsaturated anhydride is maleic anhydride.

16. A process of claim 13 wherein about 0.2 to 0.6 equivalents of said anhydride are reacted in step (c).

* * * * *